US009082503B2

(12) United States Patent
Kim

(10) Patent No.: US 9,082,503 B2
(45) Date of Patent: Jul. 14, 2015

(54) SEMICONDUCTOR MEMORY DEVICE AND METHOD OF OPERATING THE SAME

(75) Inventor: Do Young Kim, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 160 days.

(21) Appl. No.: 13/601,448

(22) Filed: Aug. 31, 2012

(65) Prior Publication Data

US 2013/0336069 A1    Dec. 19, 2013

(30) Foreign Application Priority Data

Jun. 13, 2012    (KR) .......................... 10-2012-0063199

(51) Int. Cl.
*G11C 11/34*    (2006.01)
*G11C 16/34*    (2006.01)

(52) U.S. Cl.
CPC .................................. *G11C 16/3459* (2013.01)

(58) Field of Classification Search
USPC ............... 365/185.03, 185.12, 185.18, 85.19, 365/185.22, 185.24, 185.29, 185.17, 185.33
See application file for complete search history.

(56) References Cited

U.S. PATENT DOCUMENTS

| 7,986,565 | B2 * | 7/2011 | Chun et al. | 365/185.29 |
|---|---|---|---|---|
| 8,284,611 | B2 * | 10/2012 | Lee | 365/185.22 |
| 8,351,270 | B2 * | 1/2013 | Ahn | 365/185.22 |
| 8,422,305 | B2 * | 4/2013 | Lee | 365/185.22 |
| 8,446,776 | B2 * | 5/2013 | Hwang et al. | 365/185.18 |
| 8,456,907 | B2 * | 6/2013 | Kim et al. | 365/185.03 |
| 8,553,465 | B2 * | 10/2013 | Park | 365/185.22 |
| 8,559,229 | B2 * | 10/2013 | Kim et al. | 365/185.24 |
| 8,611,155 | B2 * | 12/2013 | Kim et al. | 365/185.19 |

* cited by examiner

*Primary Examiner* — Trong Phan
(74) *Attorney, Agent, or Firm* — William Park & Associates Ltd.

(57) ABSTRACT

The present disclosure relates to a semiconductor device and a method of operating the semiconductor device, and particularly to a semiconductor memory device including a memory cell array and a method of operating the semiconductor memory device. The memory device includes a memory cell array including a plurality of memory cells; and a peripheral circuit configured to program a selected memory cell into a target program state, wherein the peripheral circuit performs a program operation by applying a bit line voltage determined according to the threshold voltage to a bit line of the selected memory cell when a threshold voltage of the selected memory cell is higher than a first verification voltage and is lower than a second verification voltage.

12 Claims, 3 Drawing Sheets

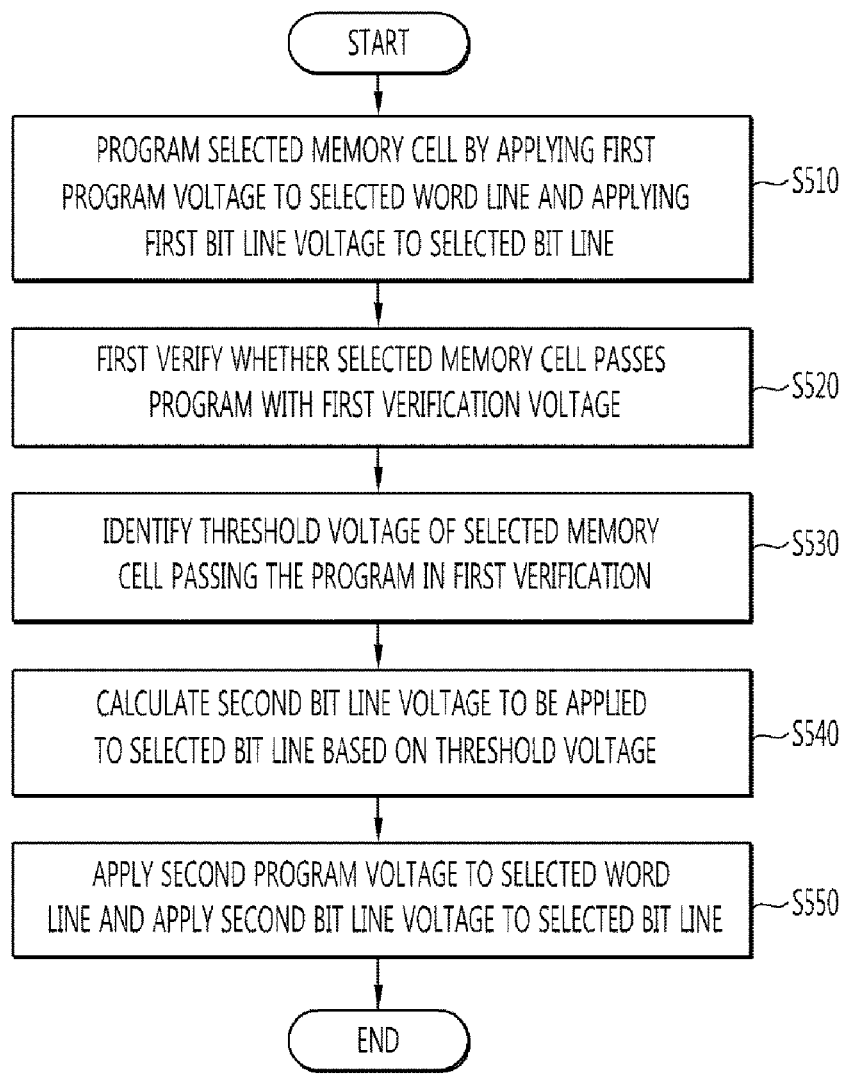

SEMICONDUCTOR MEMORY DEVICE AND METHOD OF OPERATING THE SAME

CROSS-REFERENCE TO RELATED APPLICATION

This application claims priority to Korean Patent Application No. 10-2012-0063199, filed on Jun. 13, 2012, in the Korean Intellectual Property Office, the entire disclosure of which is incorporated by reference herein in its entirety.

BACKGROUND

1. Field of the Invention

The present invention relates to a semiconductor device and a method of operating the semiconductor device, and more particularly to a semiconductor memory device including a memory cell array and a method of operating the semiconductor memory device.

2. Description of the Related Art

Generally, a flash memory device applies a program voltage to a word line when programming a memory cell. Accordingly, the same program voltage is applied to memory cells connected to the same word line. In the memory cells connected to the same word line, program cells and program inhibition cells may coexist. The program cells and the program inhibition cells have the same voltage applied to the word line, but the program and inhibition cells are discriminated by a type of voltage applied to a bit line. For example, a ground voltage is applied to the bit line of the program cells, and a power voltage is applied to the bit line of the program inhibition cells. In order to decrease a range of a threshold voltage distribution in a program state, gradationally increased program pulses with a predetermined step are applied to the word line. As a result, a threshold voltage of each memory cell is gradationally increased, to reach a target program state.

FIG. 1 is a graph illustrating movement of threshold voltages of program memory cells according to a program method in the related art.

Referring to FIG. 1, gradationally increased program pulses with predetermined program voltage increments are applied to a word line of a selected memory cell. This is referred to as an Incremental Step Pulse Program (ISPP) method. In the process of being programmed from an erase state E to a target program state P1, the selected memory cell may temporarily have a threshold voltage Vth larger than a first verification voltage PV1$a$ and smaller than a second verification voltage PV1$b$. That is, the selected memory cell has a threshold voltage distribution corresponding to a temporal program state T at a certain time point. A bit line voltage VBL applied to a bit line is maintained as 0V until the threshold voltage Vth of the selected memory cell reaches the first verification voltage PV1$a$, but when the threshold voltage Vth of the selected memory cell becomes larger than the first verification voltage PV1$a$, the bit line voltage VBL applied to the bit line is changed to XV, and the bit line voltage is maintained as XV until the threshold voltage Vth of the selected memory cell reaches the second verification voltage PV1$b$. When threshold voltage Vth of the selected memory cell becomes larger than the second verification voltage PV1$b$ in response to progress of the program operation, a power voltage Vcc is applied to the bit line such that the selected memory cell is in a program completed state and thus is not programmed any more. When the threshold voltage Vth is larger than the first verification voltage PV1$a$ and smaller than the second verification voltage PV1$b$, the bit line voltage VBL applied to the bit line is a constant XV regardless of the threshold voltage Vth. Accordingly, degrees of increase of the threshold voltages at point a, point b, and point c are the same, so that the threshold voltages move to point a', point b', and point c'. That is, the bit line voltage VBL applied to the memory cell having the threshold voltage at point c is the same as the bit line voltage VBL applied to the memory cell having the threshold voltage at point a. Such a program method in the related art makes it difficult to form a narrow threshold voltage distribution of the target program state P1.

SUMMARY

The present disclosure has been made in an effort to provide a semiconductor memory device capable of improving an operational characteristic and a method of operating the semiconductor memory device.

An example embodiment of the present disclosure provides a semiconductor memory device including: a memory cell array including a plurality of memory cells; and a peripheral circuit configured to program a selected memory cell into a target program state, wherein the peripheral circuit performs a program operation by applying a bit line voltage determined according to the threshold voltage to a bit line of the selected memory cell when a threshold voltage of the selected memory cell is larger than a first verification voltage and is smaller than a second verification voltage. Another example embodiment of the present disclosure provides a method of operating a semiconductor memory device which programs a selected memory cell into a target program state, the method including: programming a selected memory cell by applying a first program voltage to the selected word line and applying a first bit line voltage to a selected bit line; performing a first verifying operation of determining whether the selected memory cell passes a program with a first verification voltage; identifying a threshold voltage of the selected memory cell passing the program in the first verifying operation; calculating a second bit line voltage to be applied to the selected bit line based on the threshold voltage; and programming the selected memory cell by applying a second program voltage to the selected word line and applying the second bit line voltage to the selected bit line.

According to the example embodiments of the present disclosure, the operational characteristic of a semiconductor device may be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing example embodiments thereof with reference to the attached drawings in which:

FIG. 5 illustrates a method of driving a semiconductor memory device according to an example embodiment of the present invention.

DETAILED DESCRIPTION

In order to fully understand the present invention, an operational advantage of the present invention, and an object achieved through example embodiments of the present invention, the accompanying drawings describing example embodiments of the present invention and the contents described with reference to the drawings will be referenced.

Hereinafter, example embodiments of the present invention will be described with reference to the accompanying drawings. However, the present invention is not limited to an embodiment disclosed below and may be implemented in various forms. These embodiments are provided only for illustrative purposes and for an understanding of a scope of the present invention by those skilled in the art.

Hereinafter, the present invention will be described through describing example embodiments of the present invention with reference to the accompanying drawings.

Figure 2:
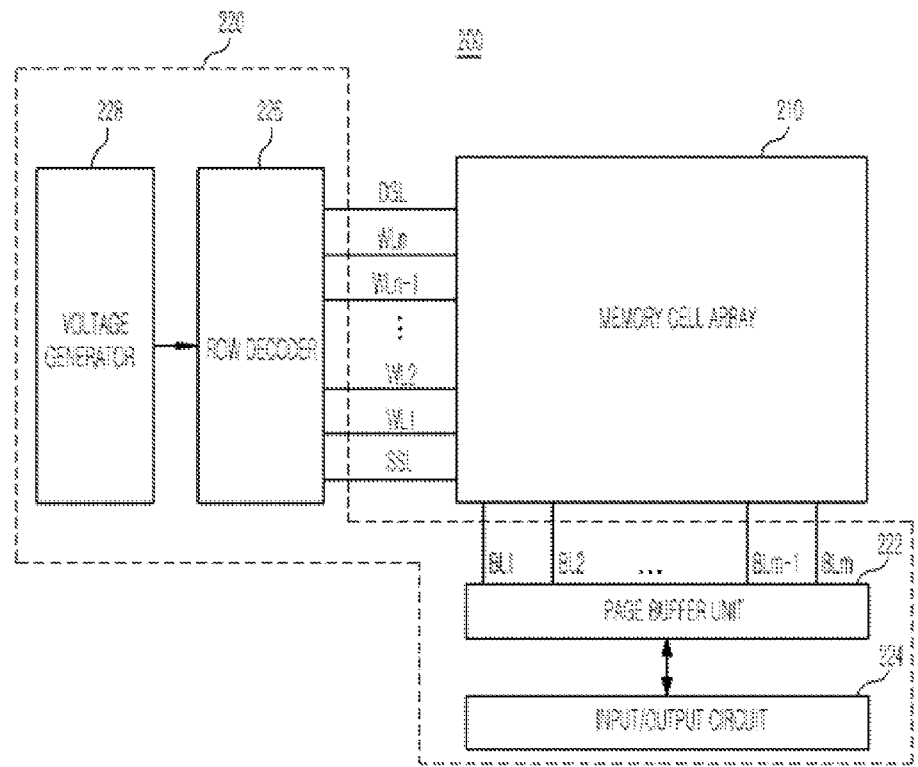
FIG. 2 illustrates a semiconductor memory device according to an example embodiment of the present invention.

FIG. 2 illustrates a semiconductor memory device according to an example embodiment of the present invention.

Referring to FIG. 2, a semiconductor memory device 200 includes a memory cell array and a peripheral circuit 220. The peripheral circuit 220 is coupled to lines SSL, WL1 to WLn, DSL of the memory cell array 210. The semiconductor memory device 200 may include the peripheral circuit 220 which may include a page buffer unit 222, an input/output circuit 224, a row decoder 226, and a voltage generator 228. The memory cell array 210 is a data storing region of the semiconductor memory device 200, and includes memory cells (not shown) connected to Bit Lines (BL1 to BLm) and Word Lines (WL1 to WLn). The respective memory cells (not shown) of the memory cell array 210 has an erase state and a programmed state. The respective memory cells (not shown) may store single bit data or multi bit data in connection with the programmed state. A memory cell for storing the single bit data is referred to as a Single Level Cell (SLC), and a memory cell for storing multi bit data of two bits or more is referred to as a Multi Level Cell (MLC). The SLC has the erase state and one program state according to a threshold voltage. The MLC has an erase state and a plurality of program states according to a threshold voltage. The MLC is programmed with any one of a distribution of a plurality of threshold voltages so as to store multiple bits in one cell.

The page buffer unit 222 is operated as a write driver or a sense amplifier according to an operation mode. For example, the page buffer unit 222 operates as the sense amplifier in a reading operation mode and as the write driver in a program operation mode. The reading operation may be an operation of identifying a program state of a cell transistor. That is, the reading operation may be an operation of fetching data stored in the cell transistor. A program section and a verification section are included in the program operation mode. A verification operation in the verification section also corresponds to the operation of identifying the program state of the cell transistor, just as in the reading operation. The page buffer unit 222 receives data to be programmed in the program operation from the input/output circuit 224 and stores the received data in an internal latch (not shown).

The input/output circuit 224 may transfer an address or program data input through an input/output terminal. The input/output circuit 224 may transfer the stored address to an address buffer (not shown), the program data to the page buffer unit 222, and a command to a command register (not shown). In the reading operation, the read data provided from the page buffer unit 222 may be output outside the memory device 200 through the input/output circuit 224. The row decoder 226 generally selects a word line in response to a row address. The row decoder 226 transfers various word line voltages provided from the voltage generator 228 to the word line. In the program operation, the row decoder transfers a program voltage to the selected word line and a pass voltage to a non-selected word line. In the reading operation, the row decoder 226 provides a read voltage provided from the voltage generator 228 to the selected word line and the pass voltage to a non-selected word line. The voltage generator 228 may provide a general voltage for a program of the semiconductor memory device 200.

Figure 3:
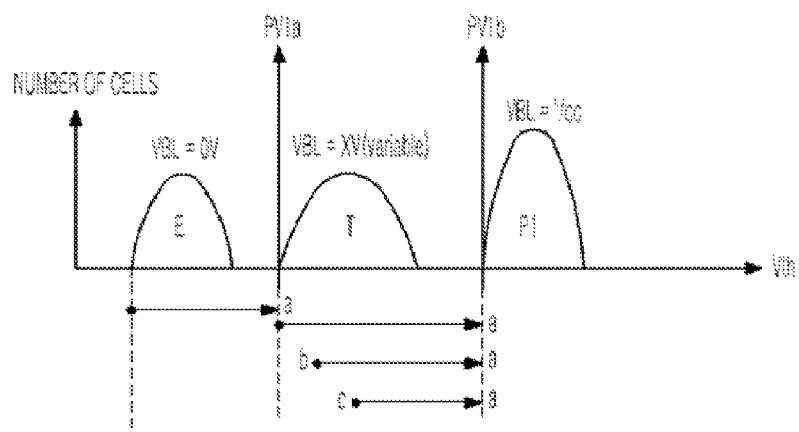
FIG. 3 illustrates movement of threshold voltages of program memory cells according to a program method of the semiconductor memory device illustrated in FIG. 2.

FIG. 3 illustrates a program method of the semiconductor memory device illustrated in FIG. 2.

Hereinafter, an operation method of the semiconductor memory device 200 according to an example embodiment of the present invention will be described in detail with reference to FIGS. 2 and 3.

Figure 1:
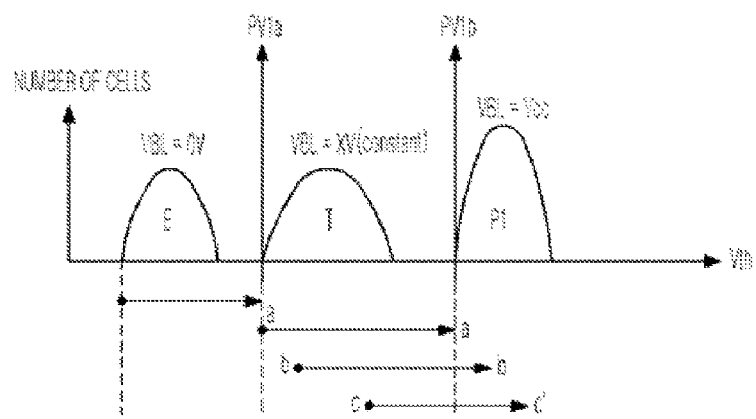
FIG. 1 illustrates movement of threshold voltages of program memory cells according to a program method in the related art.

The peripheral circuit 220 programs selected memory cells of the memory cell array 210 from an erase state E into at least one program state. Specifically, the peripheral circuit 220 programs the selected memory cells into a target program state P1. The page buffer unit 222 may provide the bit line voltage VBL to the bit lines BL1 to BLm of the selected memory cells in the program operation. When the threshold voltage Vth of the selected memory cell is larger than a first verification voltage PV1$a$ and smaller than a second verification voltage PV1$b$, the bit line voltage VBL is varied according to a threshold voltage Vth before the programming of the selected memory cell. This is different from the method in the related art illustrated in FIG. 1. When the threshold voltage Vth of the selected memory cell is smaller than the first verification voltage PV1$a$, the bit line voltage VBL may be 0 V. When the threshold voltage Vth of the selected memory cell is larger than the second verification voltage PV1$b$, the program is in a completed state, so the bit line voltage VBL may be the power voltage Vcc such that the selected memory cell is not programmed any more. First, a program method in a case where the threshold voltage Vth of the memory cell is smaller than the first verification voltage PV1$a$ will be described. That is, this is a case in which the selected memory cells have been programmed in the erase state E and reach a temporal program state T. Gradationally increasing program pulses by a first increment and applying the increased program pulses to the word line of the selected memory cell. If the first increment is relatively large, a program time is shortened. The bit line voltage VBL applied to the bit lines BL1 to BLm when the threshold voltage Vth of the selected memory cell is larger than the first verification voltage PV1$a$ and smaller than the second verification voltage PV1$b$ is determined by the following method. First, a difference value between the second verification voltage PV1$b$ and the threshold voltage Vth of the selected memory cell is calculated so as to make the bit line voltage applied to the bit line to be different according to the calculated difference value. As illustrated in FIG. 3, when the different bit line voltages VBLs are applied when the selected memory cell is programmed at point a, point b, or point c, all of point a, point b, and point c may move to point a'. That is, a relatively high bit line voltage VBL is applied for a memory cell having the threshold voltage Vth around the second verification voltage PV1$b$ due to a weak electric field between a floating gate and a channel, and a relatively low bit line voltage VBL is applied for a memory cell having the threshold voltage Vth spaced far below the second verification voltage PV1b because of a strong electric field between a floating gate and a channel. As a result, in the semiconductor memory device 200 according to the example embodiment of the present invention, as described above, a different bit line voltage VBL is applied to the bit line according to a current threshold voltage Vth, so that the distribution of the threshold voltages Vth in the target program state P1 formed after the program completion may be formed to have a narrow range. When the selected memory cell is programmed from the erase state E to the temporal program state T, incremental step program pulses having relatively large increments are applied to the word line and 0 V of the voltage is simultaneously applied to the bit line, thereby increasing a program rate. When the selected memory cell is programmed from the temporal program state T to the target program state P1, the incremental step program pulses having a relatively small increment are applied to the word line and the optimum bit line voltage according to the threshold voltage is simultaneously applied to the bit line, thereby forming the narrow range of the threshold voltage distribution.

Figure 4:
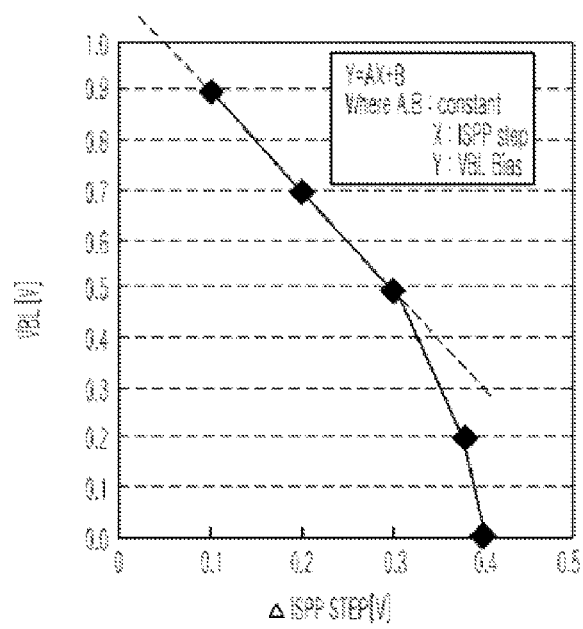
FIG. 4 illustrates an example of a linear function for calculating a bit line voltage in the semiconductor memory device illustrated in FIG. 2.

FIG. 4 illustrates an example of a linear function for calculating the bit line voltage VBL to be applied to a bit line when memory cells in the temporal program state T are programmed in the semiconductor memory device according to an example embodiment of the present invention described with reference to FIGS. 2 and 3.

Referring to FIG. 4, a horizontal axis (X-axis) corresponds to a difference value ISPP STEP which is a difference between the second verification voltage PV1b and the threshold voltage Vth, and a vertical axis (Y-axis) corresponds to the bit line voltage VBL. As described above, the second verification voltage PV1b is a reference voltage for determining whether the selected memory cell is programmed into the target program state P1. The bit line voltage VBL is determined based on a difference value between the second verification voltage PV1b and the current threshold voltage Vth of the selected memory cell. When the difference value between the second verification voltage PV1b and the current threshold voltage Vth of the selected memory cell is 0.1 V a bit line voltage VBL of 0.9 V is applied, when the difference value between the second verification voltage PV1b and the current threshold voltage Vth of the selected memory cell is 0.2 V a bit line voltage VBL of 0.7 V is applied, and when the difference value between the second verification voltage PV1b and the current threshold voltage Vth of the selected memory cell is 0.3 V a bit line voltage VBL of 0.5 V is applied. As the difference value between the second verification voltage PV1b and the current threshold voltage Vth of the selected memory cell becomes larger, a size of the bit line voltage VBL becomes smaller. When the program voltage applied to the word line of the selected memory cell is the same, as the bit line voltage VBL applied to the bit line of the selected memory cell becomes larger, a size of an effective electric field applied between the floating gate and the channel of the memory cell becomes smaller. Accordingly, as a higher bit line voltage is applied to the bit line of the selected memory cell, a degree of increase of the threshold voltage is decreased. When the program pulses applied to the word line are incremental step pulses gradationally increasing with the predetermined increment, the threshold voltage distribution with a narrow range may be formed like a case in which the program pulses with the small increment are applied. The linear function, Y=AX+B, may be induced from the graph illustrated in FIG. 4. Here, A and B are constants and may be experimentally obtained. X is an independent variable of the linear function and corresponds to the difference value ISPP STEP between the second verification voltage PV1b and the threshold voltage Vth, and Y is a dependent variable of the linear function and corresponds to the bit line voltage VBL.

FIG. 5 illustrates a method of driving a semiconductor memory device according to another example embodiment of the present invention.

Referring to FIG. 5, the method of driving a semiconductor memory device according to another example embodiment of the present invention includes a program operation comprised of programming a selected memory cell by applying a first program voltage to a selected word line and applying a first bit line voltage to a selected bit line (S510). A first verifying operation may be performed to determine, with a first verification voltage, whether the selected memory cell passes the program operation (S520). Whether the selected memory cell passes the program operation may be verified by determining whether a threshold voltage of the selected memory cell is larger than a first verification voltage and smaller than a second verification voltage. A threshold voltage of the selected memory cell is identified when it is determined that the selected memory cell passes the program operation in the first verifying operation (S530). A second bit line voltage to be applied to the selected bit line is calculated based on the threshold voltage (540). And the selected memory cell is programmed by applying a second program voltage to the selected word line and applying the second bit line voltage to the selected bit line (S550). The second bit line voltage may be calculated based on a difference value which may correspond to a difference between the second verification voltage corresponding to the target program state and the threshold voltage. The second bit line voltage may correspond to a dependent variable of a linear function, Y=AX+B, having the difference value as an independent variable. The first program voltage may be a gradationally increasing program pulses that is increasing by a first increment. The second program voltage may be a gradationally increasing program pulses that is increasing by a second increment. The first increment is larger than the second increment. That is, the selected memory cell is programmed in a fast rate with the large first increment, and is programmed with the small second increment such that the threshold voltage distribution is formed to have a narrow range. The method of driving the semiconductor memory device according to another example embodiment of the present invention may further include a second verifying operation comprised of determining whether the selected memory cell passes a program operation, where the second verifying operation may include programming the selected memory cell into the target program state with a second verification voltage. In a case where the selected memory cell passes the second verifying operation, when the second program voltage is applied to the selected word line, a power voltage is applied to the selected bit line, so that the selected memory cell may not be further programmed.

As described above, the example embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device comprising:
a memory cell array including a plurality of memory cells; and
a peripheral circuit configured to perform a program operation on a selected memory cell into a target program state by applying one of a ground voltage, a power voltage and a bit line voltage between the ground voltage and the power voltage to a bit line of the selected memory cell when a program voltage is applied to a word line of the selected memory cell,
wherein the peripheral circuit is configured to change the bit line voltage according to a threshold voltage of the selected memory cell and apply the bit line voltage to the bit line of the selected memory cell when the threshold voltage of the selected memory cell is higher than a first verification voltage and is lower than a second verification voltage, and
wherein the bit line voltage is determined based on a difference value which corresponds to a difference between the second verification voltage and the threshold voltage.

2. The semiconductor memory device of claim 1, wherein the bit line voltage corresponds to a dependent variable of a linear function having the difference value as an independent variable.

3. The semiconductor memory device of claim 1, wherein the peripheral circuit applies gradationally increasing program pulses to the word line of the selected memory cell, and applies one of the ground voltage, the bit line voltage, and the power voltage to the bit line of the selected memory cell.

4. The semiconductor memory device of claim 1, wherein the peripheral circuit performs a first program operation of applying gradationally increasing program pulses with a first increment to a word line of the selected memory cell and programming the selected memory cell into a temporal program state with the first verification voltage as a verification voltage, and a second program operation of applying gradationally increasing program pulses with a second increment to a word line of the selected memory cell and programming the selected memory cell into a program state with the second verification voltage as a verification voltage.

5. The semiconductor memory device of claim 4, wherein the first increment is larger than the second increment.

6. A method of operating a semiconductor memory device, the method comprising:
programming a selected memory cell having a threshold voltage lower than a second verification voltage by applying a first program voltage to a selected word line and applying a first bit line voltage to a selected bit line;
performing a first verifying operation of determining whether the selected memory cell passes a program with a first verification voltage;
identifying the threshold voltage of the selected memory cell passing the program in the first verifying operation;
calculating a second bit line voltage to be applied to the selected bit line of the selected memory cell having the threshold voltage higher than the first verification voltage and lower than the second verification voltage; and
programming the selected memory cell having the threshold voltage lower than the second verification voltage by applying a second program voltage to the selected word line and applying the second bit line voltage calculated based on the threshold voltage to the selected bit line,
wherein the second bit line voltage is calculated based on a difference value which corresponds to a difference between the second verification voltage corresponding to a target program state and the threshold voltage.

7. The method of claim 6, wherein the second bit line voltage corresponds to a dependent variable of a linear function having the difference value as an independent variable.

8. The method of claim 6, wherein the first program voltage is gradationally increasing program pulses with a first increment, and the second program voltage is gradationally increasing program pulses with a second increment.

9. The method as claimed in claim 8, wherein the first increment is larger than the second increment.

10. The method as claimed in claim 9, wherein the first bit line voltage is a ground voltage.

11. The method as claimed in claim 10, further comprising a second verifying operation of determining whether the selected memory cell is programmed into the target program state with the second verification voltage.

12. The method as claimed in claim 11, wherein in a case where the selected memory cell passes the second verifying operation, when the second program voltage is applied to the selected word line, a power voltage is applied to the selected bit line.

* * * * *